United States Patent
Raju et al.

(10) Patent No.: US 11,606,099 B1
(45) Date of Patent: Mar. 14, 2023

(54) FAULT DETECTION WITHIN AN ANALOG-TO-DIGITAL CONVERTER

(71) Applicant: Texas Instruments Incorporated, Dallas, TX (US)

(72) Inventors: Veeramanikandan Raju, Bengaluru (IN); Anand Kumar G, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/482,734

(22) Filed: Sep. 23, 2021

(51) Int. Cl.
*H03M 1/06* (2006.01)

(52) U.S. Cl.
CPC .................................. *H03M 1/0604* (2013.01)

(58) Field of Classification Search
CPC .................................................... H03M 1/0694
See application file for complete search history.

(56) References Cited

U.S. PATENT DOCUMENTS

| | | | | |
|---|---|---|---|---|
| 4,679,028 A * | 7/1987 | Wilson | ................ | H03M 1/1071 341/158 |
| 4,947,106 A * | 8/1990 | Chism | .............. | G01R 31/31915 714/732 |
| 5,138,137 A * | 8/1992 | Holling | ................... | F24C 7/082 219/505 |
| 5,929,799 A * | 7/1999 | Rothenberg | .......... | H03M 1/129 341/161 |
| 6,067,035 A * | 5/2000 | Kosak | ................... | H03M 1/109 341/120 |
| 8,884,629 B1 * | 11/2014 | Kumar | ...................... | H03F 3/38 324/555 |
| 10,094,878 B1 * | 10/2018 | Narasimha | ........... | G01R 31/346 |
| 2008/0215264 A1 * | 9/2008 | Spanier | .................... | G01R 1/40 702/62 |
| 2008/0231490 A1 * | 9/2008 | Onoda | ................ | H03M 1/1076 341/155 |
| 2010/0103016 A1 * | 4/2010 | Thomas | ................ | H03M 1/188 341/155 |
| 2010/0283644 A1 * | 11/2010 | Katsuki | ............... | H03M 1/1076 341/122 |
| 2011/0132092 A1 * | 6/2011 | Thomas | ................. | G01N 27/90 341/155 |
| 2014/0152483 A1 * | 6/2014 | Holzmayer | ........ | G01N 27/9006 341/157 |

(Continued)

*Primary Examiner* — Lam T Mai
(74) *Attorney, Agent, or Firm* — Michael T. Gabrik; Frank D. Cimino

(57) ABSTRACT

An integrated circuit includes an analog-to-digital converter (ADC) having selectable first and second analog channel inputs and a digital output. A window comparator coupled to the digital output. The window comparator configured to compare a digital value on the digital output to first and second threshold values. A programmable clock circuit configured to provide a clock signal to the ADC. A controller that, response to assertion of the trigger signal, is configured to generate a sample rate control signal to the clock circuit to cause the clock circuit to increase the frequency of the clock signal and toggle selection between the first and second analog channel inputs. A result comparison circuit having a comparison input coupled to the digital output. The result comparison circuit is configured to compare a first digital conversion output from the ADC to a second digital conversion output from the ADC.

23 Claims, 6 Drawing Sheets

(56) References Cited

U.S. PATENT DOCUMENTS

| | | | | |
|---|---|---|---|---|
| 2016/0056829 A1* | 2/2016 | Glibbery | ............... | H03M 5/12 |
| | | | | 341/155 |
| 2016/0329904 A1* | 11/2016 | Duryea | ............... | H03M 1/44 |
| 2017/0003348 A1* | 1/2017 | Fedigan | ............... | G01R 31/346 |
| 2017/0025969 A1* | 1/2017 | Xu | ............... | H02M 3/33573 |
| 2020/0110659 A1* | 4/2020 | Foley | ............... | G06F 11/1076 |
| 2020/0395753 A1* | 12/2020 | Formenti | ............... | H02H 9/046 |
| 2021/0175891 A1* | 6/2021 | Gadgil | ............... | H03M 1/1245 |
| 2022/0086577 A1* | 3/2022 | Ramamurthy | ............... | H04R 29/001 |

* cited by examiner

FAULT DETECTION WITHIN AN ANALOG-TO-DIGITAL CONVERTER

BACKGROUND

An analog to digital converter (ADC) is used for converting an analog signal into digital data. ADCs are used for a variety of purposes. For example, an ADC can be used to ensure that the output signals from an analog circuit are within a predicted range, and to initiate or take corrective action otherwise.

SUMMARY

In one example, an integrated circuit includes a controller having a first controller output wherein the controller is configured to generate a sample rate control signal on the first controller output. A programmable clock circuit having a clock circuit control input and a clock output, wherein the clock circuit control input is coupled to the first control output. The programmable clock circuit configured to output a clock signal on its clock output at a first frequency responsive to the sample rate control signal being in a first logic state, and to output the clock signal at a second frequency responsive to the sample rate control signal being in a second logic state. An analog-to-digital converter (ADC) having an analog input, a clock input and a digital conversion output and the clock input coupled to the clock output. A result comparison circuit having a comparison input coupled to the digital conversion output, the result comparison circuit configured to compare a first digital conversion output from the ADC to a second digital conversion output from the ADC.

BRIEF DESCRIPTION OF THE DRAWINGS

The same reference number is used in the drawings for the same or similar (either by function and/or structure) features.

DETAILED DESCRIPTION

Figure 1A:
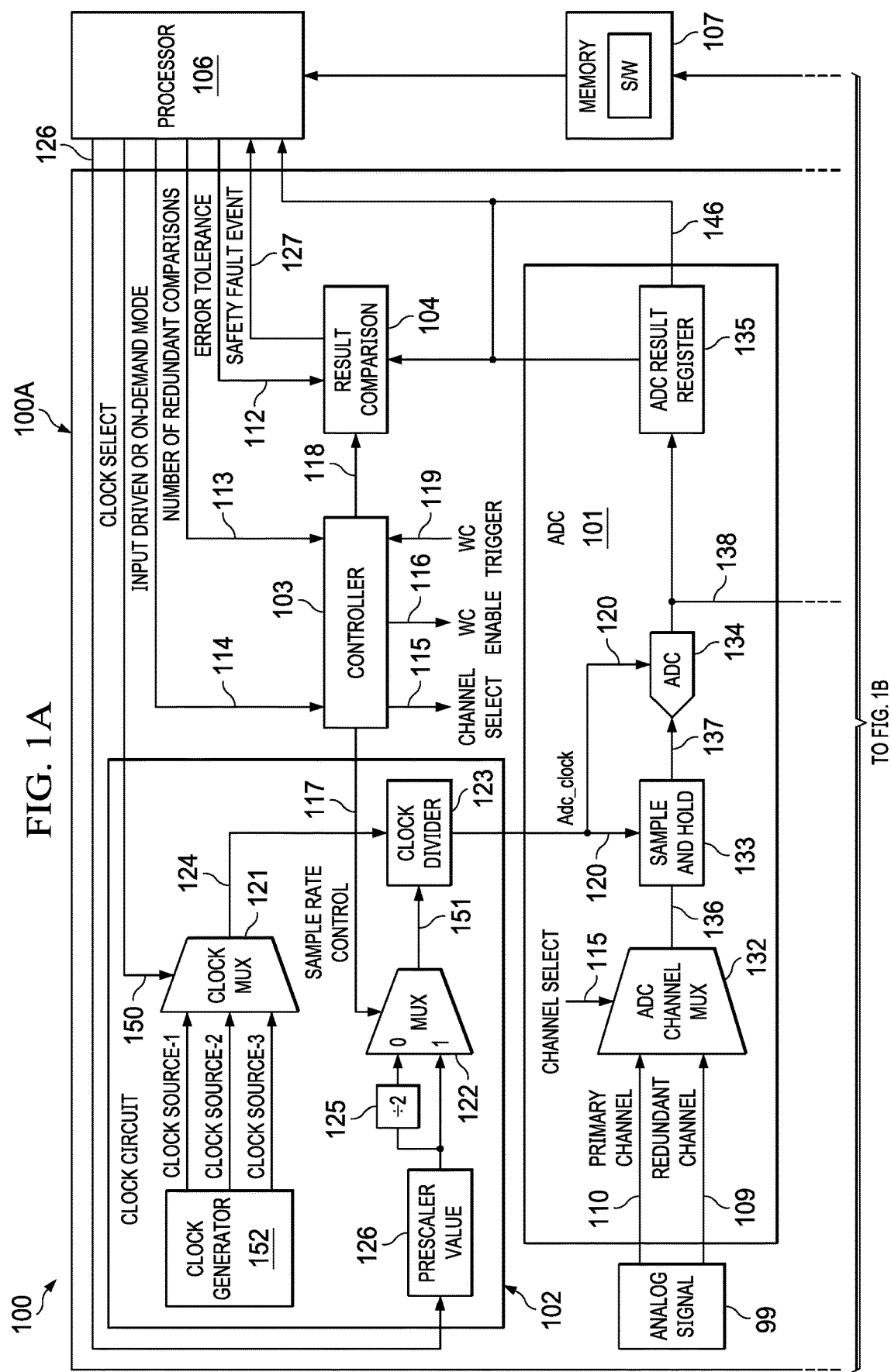
FIGS. 1A-1B illustrate a block diagram of the ADC circuit in accordance with an example.

A peripheral device includes software and hardware components that may be attached to a computer and controlled by a computer system, but may not be the core computer components such as the central processing unit (CPU, also referred to herein as "processor") or power supply unit. Peripherals may be devices which can be easily removed and plugged into a computer system or portable. Some systems have peripheral devices whose signals (e.g., sensor signals, control feedback signals, etc.) are processed by higher level electronics (e.g., a processor). The processor controls the overall operation of the system based at least in part on the signals. For example, in an industrial automation system, the processor may receive a large number of analog and digital signals from coupled sensors, controllers, and monitors as well as other networked systems. The correct operation of the system depends, at least in part, on the correct operation of the peripheral devices as determined by the appropriate signals. Some systems may benefit from implementing safety measures that determine whether the signals from the peripheral devices are within acceptable ranges. In some systems, the peripheral device signal is provided to primary and redundant peripheral units (e.g., disk drives, printers, modem, screen, etc.) and the outputs from the peripheral units are re-checked for consistency in hardware or through software. For example, two microcontrollers may be used to process the same signal from a peripheral device, and their outputs are checked using a hardware monitor external to the microcontrollers. Although such redundant implementations are straightforward, the cost of the solution may be prohibitive in some applications.

The embodiments described are directed to an ADC circuit that may operate in a on-demand mode and/or an input-driven mode for purposes of ensuring analog input signal integrity, reliability and a higher degree of safety compliance. The ADC circuit checks for an abnormal analog input signal (e.g., outside a predetermined range) and, upon detecting an abnormal input signal, responds to the abnormal condition by automatically reconfiguring itself to perform a predetermined or programmable number of redundant comparisons from redundant ADC channel conversions. The results of the comparisons are compared with a predetermined or programmable error tolerance value. If the predetermined error value is less than the result of the comparisons, a safety fault flag (or other type of fault indicator signal/data) is set and sent to the processor. The processor responds to the asserted safety fault flag by, for example, sending a result notification to the application(s) that is using the digital output of the ADC circuit. Instead of the digital value derived from a potentially erroneous analog signal, the application may use a default digital value. Systems that incorporate redundant circuits or use an external hardware monitor to check for consistency may not be feasible (e.g., cost, power consumption, etc.). By contrast, the ADC circuit described herein reduces the need for redundant monitor circuits, thereby saving on power consumption and reducing cost. Further, the described ADC circuit permits its digital output to continue to be used by downstream applications while the error checking is being performed.

Figure 1B:
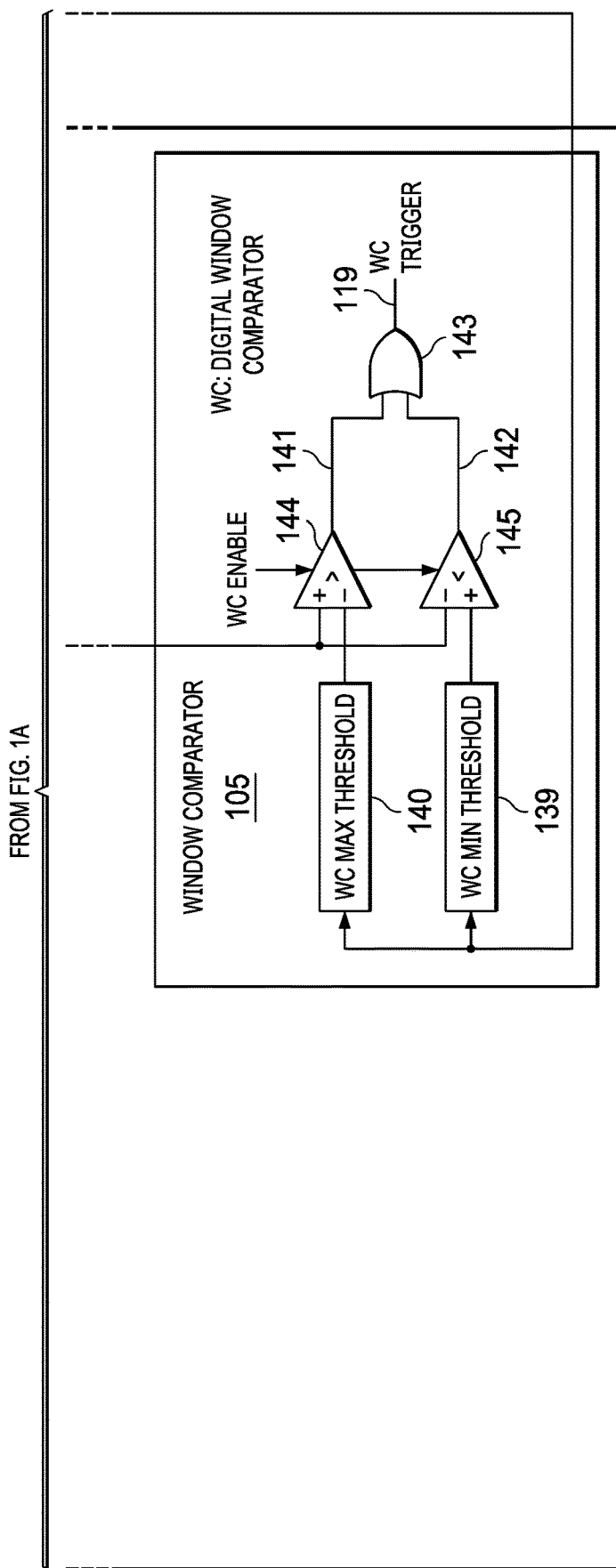

FIG. 1 is a schematic of a system 100 (e.g., an integrated circuit, IC) that includes a processor 106, a memory 107, and an ADC circuit 100a. The memory 107 may be volatile or non-volatile memory, readable and writeable memory, read-only (e.g., ROM), etc. The processor 106 may be any type of circuitry that executes software (e.g., a microprocessor, a microcontroller, etc.). The ADC circuit 100a includes a programmable clock circuit 102, an ADC signal path 101, functional safety controller 103, a result comparison circuit 104, and a window comparator circuit 105. The ADC signal path 101 includes an ADC channel multiplexer 132, a sample-and-hold circuit 133, an ADC 134, and an ADC result register 135. The ADC signal path 101 can receive an analog input signal on any, some, or all of the input channels of the ADC channel multiplexer 132. In the example of FIG. 1, the ADC channel multiplexer 132 includes a primary channel 110 and a redundant channel 109. The channels 109 and 110 are generally identical and the reference to "primary" and "redundant" refers to the use of the channels. The ADC channel multiplexer 132 may include additional analog input channels as well (an n-input multiplexer in which "n" is greater than or equal to two). An analog signal 99

(e.g., a signal from a sensor) is coupled to both the primary and redundant channels 110 and 109 of the ADC channel multiplexer 132. During normal operation (e.g., no anomalous signal being detected), only the primary channel 110 is used. Upon detection of an anomalous signal on the primary channel 110 (e.g., the digital conversion of the analog signal 99 is outside a predetermined acceptable range) or in accordance with a predetermined rate (e.g., once per second), both the primary and redundant channels are used to confirm whether an error is actually present as explained herein.

The sample-and-hold circuit 133 samples and holds the analog input signal from the ADC channel multiplexer 132. The ADC 134 then converts the sampled analog input signal to a digital value and stores the resulting digital value in the ADC result register 135 for subsequent retrieval by, for example, the processor 106. The conversion and sampling rate of the analog signal is controlled by the clock circuit 102.

The clock circuit 102 is an example of a programmable variable-frequency clock circuit and includes a clock multiplexer 121, a multiplexer 122, and a clock divider 123. In this example, the clock multiplexer 121 has three inputs: Clock Source-1, Clock Source-2, and Clock Source-3, although the clock multiplexer can have a different number of inputs from that shown (e.g., two or more inputs). The frequencies of the clocks Clock Source-1, 2, and 3 may different from each other or the same. In one example, one of the clocks is 75 KHz and another clock is 150 KHz. A clock generator 152 is included to generate the clock signals: Clock Source-1, 2, and 3.

The processor 106 generates a Clock Select signal 150 which is provided to the select input of the clock multiplexer 121. The Clock Select signal 150 causes a clock signal on a respective one of the inputs of the clock multiplexer 121 to be provided as the output signal on the multiplexer's output 124. The output 124 of the clock multiplexer 121 provides one of its clock inputs (per the selection signal 150 from the processor 106) to an input of the clock divider 123. The frequency of the clock signal provided from the clock multiplexer 121 to the clock divider 123 is divided down by the clock divider 123 based on a divide signal 151 from the multiplexer 122. The multiplexer 122 receives a prescaler value 126 on its 1-input, and a value 125 that is one-half of the prescaler value on its 0-input. The functional safety controller 103 generates a sample rate control signal 117 as a selection signal for multiplexer 122. In response to the sample rate control signal 117, multiplexer 122 provides either the prescaler value 126 or value 125 (one-half of the prescaler value) as the divide signal 151 to the clock divider 123. The frequency of the clock signal on the clock multiplexer's output 124 is divided down by either the prescaler value 126 or value 125 (half of the prescaler value) as specified by the sample rate control signal 117 from the functional safety controller 103. The output from the clock divider 123 is a clock signal called ADC_CLOCK 120, which is provided to the sample and hold circuit 133 to control its operation and to the ADC 134 to control its operation. Accordingly, the frequency of the ADC_CLOCK 120 is either the frequency of the clock signal on the output 124 of the clock multiplexer 121 divided by the prescaler value 126, or one-half of that prescaler value 125.

The ADC channel multiplexer 132 has multiple inputs, as explained above. One of the inputs (e.g., 110) may be used as the "primary" channel and another input (e.g., 109) may be used as the "redundant" channel. A channel being used as the primary channel receives the analog input signal to be converted to a digital value for subsequent use by a downstream device or application (e.g., an application executed by processor 106). A channel being used as the redundant channel is used, for example, when a potential error has been detected on the primary channel's analog signal, for example, the primary channel's analog signal is outside of a predetermined range as explained below. In one example, the analog signal provided to any channel of the ADC channel multiplexer 132 may be any type of analog signal such as a sensor signal. The ADC channel multiplexer 132 has a select input which receives a channel select signal 115 from the functional safety controller 103. The channel select signal 115 causes the ADC channel multiplexer 132 to select the analog signal from either channel 109 or channel 110 to be sampled and held by the sample-and-hold circuit 133. The sample and hold circuit 133 also receives the output ADC_CLOCK 120 from the clock divider 123. The sample-and-hold circuit 133 uses the ADC_CLOCK 120 to control the rate at which the analog signal is sampled (e.g., the number of samples per second). Upon being clocked by the ADC_CLOCK 120, the sample and hold circuit 133 generates an output signal 137 which is an analog voltage (or current) of the analog input signal from the ADC channel multiplexer 132. The ADC 134 may be a delta-sigma ADC, dual slope ADC, pipelined ADC, flash ADC, etc. The ADC 134 uses the ADC_CLOCK 120 to convert the sampled analog signal 137 from the sample and hold circuit 133 to a digital value. The ADC 134 then stores the resulting digital value in the ADC result register 135. The processor 106 can read converted digital values from the ADC result register 135 via signal line(s) 146. The processor 106 may then store the digital values read from register 135 in memory 107 and/or process the register's digital values directly without first storing them in memory 107.

The combination of the sample-and-hold circuit 133 and the ADC 134 samples and converts analog input signals to digital output values at a rate that is controlled by the ADC_CLOCK 120 from the clock circuit 102. As described below, responsive to a potential error being detected in the magnitude of the input analog signal (e.g., the magnitude is outside of an expected range), the frequency of the ADC_CLOCK 120 may be doubled (e.g., by selecting value 125 to use as the division factor by the clock divider 123, explained below) to thereby double the analog-to-digital conversion rate. Twice the number of converted digital values per unit time are stored in the ADC result register 135, and the digital values can be compared to each other (e.g., back-to-back digital conversion values), by the result comparison circuit 104 to confirm whether an error is present in the input analog signal. As further explained below, while this error checking is occurring, because the conversion rate has been doubled, every other digital value can still be consumed by a downstream process executing on the processor 106 thereby maintaining the same data rate to such a process.

The processor 106 generates an error tolerance signal 112, which is provided to the result comparison circuit 104. The error tolerance 112 may be a preset value set in the software code and/or stored in the memory 107. The functional safety controller 103 generates a RESULT_COMPARAISON_ENABLE signal 118 to the result comparison circuit 104. The RESULT_COMPARAISON ENABLE signal 118 goes high after the WC Trigger 119 goes high which implies an abnormal signal has been detected. This enables the result comparison circuit 104 to receive a successive pair of digital values to compare. The result comparison circuit 104 receives and compares digital values 146 from the ADC result register 135. In one embodiment (and as further explained in FIGS. 4 and 5), the result comparison circuit 104 compares successive digital values form the primary and redundant channels (e.g., primary channel, then redundant channel, then primary channel, then redundant channel, and so on) and determines whether the difference between a successive pair of primary and redundant channel digital values is less than (no error) or greater than (error) the error tolerance specified by the processor 106. Responsive to the difference between a primary/redundant channel digital value pair exceeding the error tolerance, the result comparison circuit 104 generates a safety fault event signal 127 which is provided to the input of the processor 106; otherwise, the safety fault event signal is not asserted by the result comparison circuit.

The functional safety controller 103 receives an input-driven mode or on-demand mode signal 114 from the processor 106, as well as a signal 113 indicative of the number of redundant comparisons to be performed by the result comparison circuit 104. The number of redundant comparisons may be a preset value in software code and/or stored in memory 107. The functional safety controller 103 generates the sample rate control signal 117 which is provided to the control select input of multiplexer 122 and the channel select signal 115 to the ADC channel multiplexer 132. The functional safety controller 103 also generates a window comparator (WC) enable signal 116 which enables (and disables) the window comparator circuit 105. The WC trigger signal 119 is generated by the window comparator circuit 105 (as explained below) and is provided to the functional safety controller 103.

If the input-driven mode or on-demand mode signal 114 specifies the input-driven mode, redundant sampling and primary/redundant channel comparisons are performed responsive to detecting an abnormal input signal on the primary channel 110. An example of the Input-driven mode operation is provided in FIG. 4. If the input-driven mode or on-demand mode signal 114 specifies the on-demand mode, redundant sampling and comparison is performed automatically at a set periodic rate (e.g., determined by a timer) without the use of the window comparator circuit 105. An example of the on-demand mode operation is provided in FIG. 5.

The window comparator circuit 105 includes comparators 144 and 145 and an OR gate 143 (or other type or combination of logic gates). The comparator 144 includes a non-inverting (+) input and an inverting (−) input. A WC maximum (max) threshold 140 (which may be stored in and provided from memory 107) is provided to the − input of comparator 144. Each digital value 138 from the ADC 134 is provided to the + input of the comparator 144 and thus compared to the WC max threshold 140. The comparator 144 generates an output signal 141, which is logic high if the ADC core's digital value is larger than the WC max threshold 140 and logic low otherwise. The output signal 141 from comparator 144 is provided to an input of the OR gate 143. The ADC core's digital values are also provided to the − input of comparator 145, and the comparator's+input receives a WC minimum (min) threshold 139. The comparator 145 generates an output signal 142, which is logic high if the ADC core's digital value is smaller than the WC min threshold 139 and logic low otherwise. The output signal 142 from comparator 145 is provided to another input of the OR gate 143. The window comparator circuit 105 implements a window comparison function in which the WC trigger signal 119 is asserted responsive to a current digital conversion value being greater than the WC max threshold 140 or smaller than the WC min threshold 139. The functional safety controller 103 can enable and disable the window comparator circuit 105 via WC enable signal 116.

Figure 2:
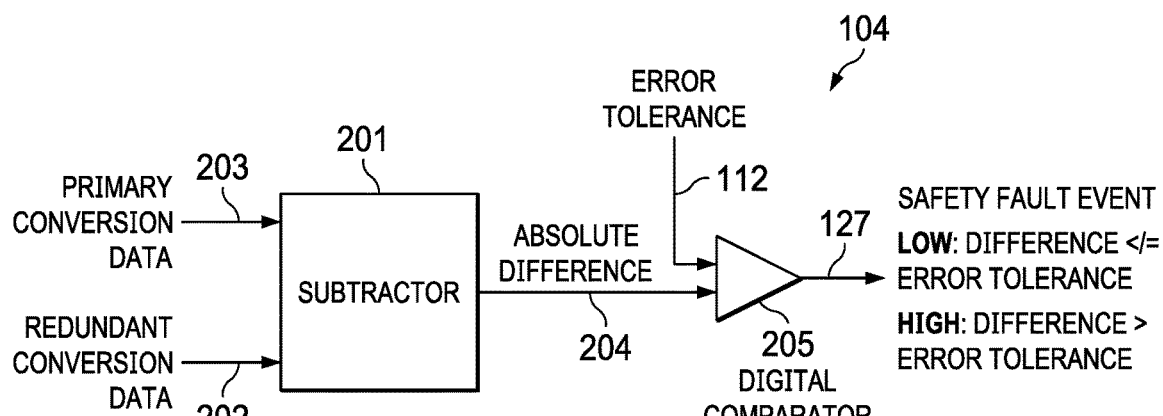
FIG. 2 illustrates a block diagram of the result comparison circuit of the ADC of FIG. 1 in accordance with an example.

FIG. 2 is a block diagram of the result comparison circuit 104 in accordance with an example. The result comparison circuit 104 includes a subtractor 201 coupled to a digital comparator 205. Inputs to the subtractor 201 include a primary conversion data 203 (a digital value converted from the analog signal 99 provided to the primary channel 110) and a redundant conversion data 202 (a digital value converted from the analog signal 99 provided to the redundant channel 109). As explained herein and further illustrated in FIGS. 4 and 5, the primary conversion data 203 and the redundant conversion data 202 are consecutive digital conversions of the analog signal 99. The analog signal 99 may change over time but its slew rate should not change more than a certain rate, which is application specific.

The subtractor 201 subtracts the redundant conversion data 202 from the primary conversion data 203 (or vice versa) and produces an absolute difference value 204 (the absolute value of the difference). The digital comparator 205 compares the absolute difference value 204 to the error tolerance 112. The digital comparator 205 produces the safety fault event signal 127 based on the comparison. In one example, the safety fault event signal 127 is logic low if the absolute difference 204 is less than the error tolerance 112 or logic high if the absolute difference 204 is greater than the error tolerance 112. The ADC signal path 101 and the result comparison circuit 104 are configured to operate (e.g., by ADC_CLOCK 120) at a much faster rate than the dominant frequency of the analog signal 99. Accordingly, the difference from one digital sample to the next should not change by more than the error tolerance value 112. The error tolerance value 112 is set to represent the largest variation from one digital sample to the next digital sample for a problem free analog signal.

Figure 3:
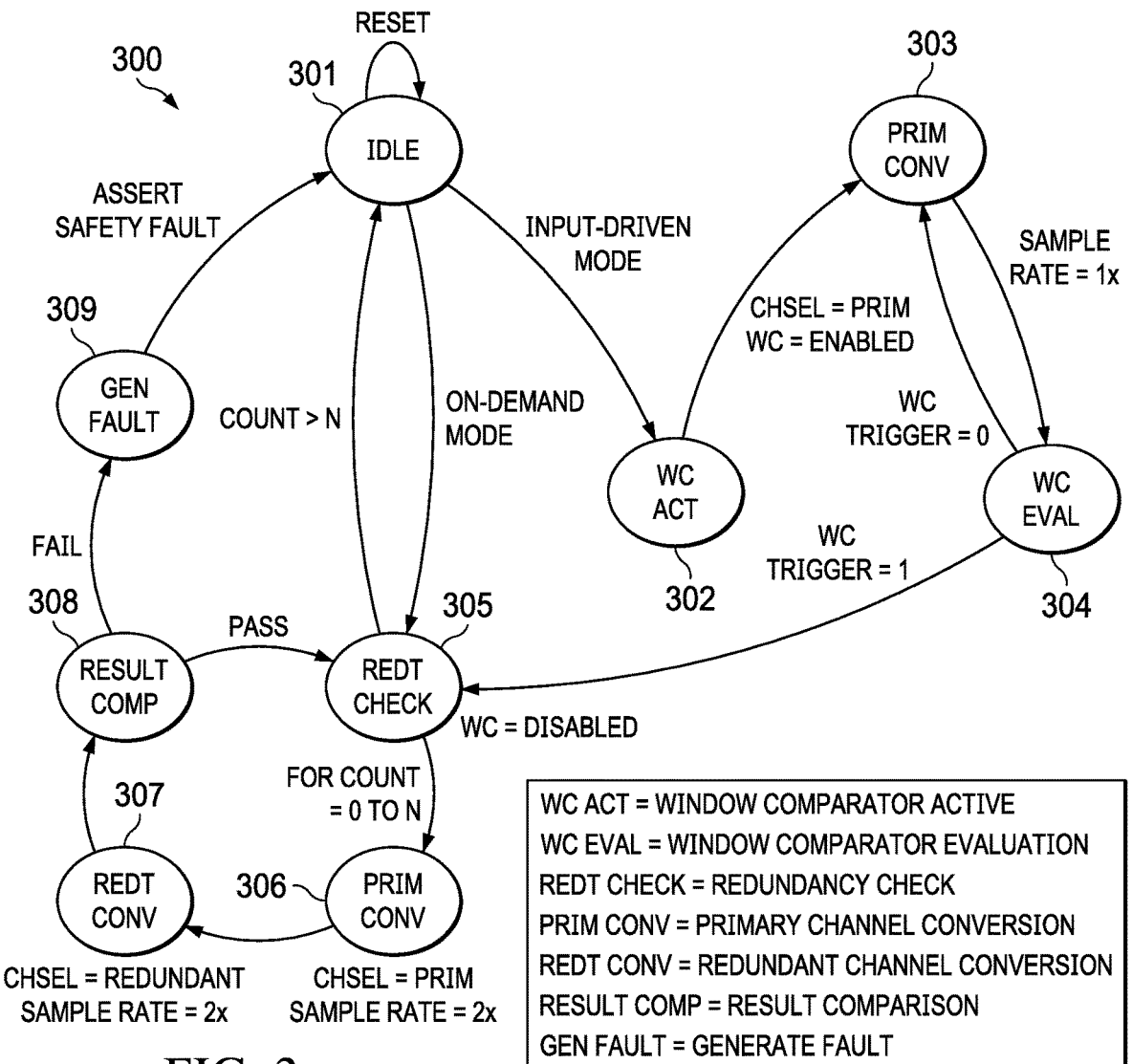
FIG. 3 is a state diagram illustrating the operation of the ADC of FIG. 1 in accordance with an example.

FIG. 3 shows an example state diagram 300 defining the operation of the functional safety controller 103. The functional safety controller 103 may be implemented as a digital circuit including logic gates, flip-flops, and other circuit components. The state diagram 300 in this example includes nine states 301, 302, 303, 304, 305, 306, 307, 308 and 309. In state 301, the functional safety controller 103 is in an idle state, which is the initial state upon power-on or a reset event.

As explained above, the processor 106 can specify the functional safety controller 103 to operate in either the input-driven mode or on-demand mode (via input-driven mode or on-demand mode signal 114). If the processor specifies the input-driven mode, then the functional safety controller 103 transitions to state 302. In state 302, the functional safety controller 103 configures the window comparator 105 to be active, for example, by asserting the WC enable signal 116 to a logic level to thereby enable comparators 144 and 145. After enabling the WC comparator 105, the functional safety controller 103 transitions to state 303 in which the functional safety controller 103 controls the channel select signal 115 to cause the ADC multiplexer 132 to select the primary channel 110 for digital conversion. The functional safety controller 103 also controls the sample rate control signal 117 to cause multiplexer 122 to select its 1-input. The analog signal 99 is then converted to a sequence of digital values at the rate controlled by the ADC_CLOCK 120 whose frequency is controlled by the prescaler value 126. FIG. 3 shows this rate as sample rate "1×."

In state 304, each digital value from the primary channel is evaluated by the window comparator 105 to determine whether that value is within the window (between the WC min and max thresholds 139 and 140) or outside the window. If the WC trigger signal 119 is low (0), meaning that the current digital value is within the window, the control loops back to state 302 and the process repeats. If, however, the WC trigger signal 119 is high (1), meaning that the current digital value is outside the window, then a transition to state 305 occurs.

In state 305, the functional safety controller 103 begins the process of comparing successive primary and redundant channel digital values. The functional safety controller 103 disables the window comparator 105 (e.g., by toggling the logic level of the WC enable signal 116). The functional safety controller 103 also changes the sample rate control signal 117 to select the 0-input of multiplexer 122 to thereby increase (e.g., double) the conversion rate implemented by the ADC SIGNAL PATH 101. In state 306, the ADC signal path 101 generates a digital conversion of the analog signal 99 via the primary channel 110. In state 307, the ADC signal path 101 generates a digital conversion of the analog signal 99 via the redundant channel 109. In state 308, the result comparison circuit 104 subtracts the primary and redundant channel conversion digital values as explained above and compares the difference to the error tolerance 112. If the difference is less than the error tolerance (pass), a transition occurs back to state 305 to repeat the process for the next successive pair of primary and redundant channel conversion values. Otherwise if the difference is greater than the error tolerance, then, at state 309, the safety fault event signal 127 is asserted to indicate a fault. The processor receives the safety fault event signal and can respond in any appropriate manner. An example of such a response includes alerting the process that is otherwise using the digital values from the ADC signal path 101 to discontinue doing so and use, for example, a default value or the last known "good" digital value.

Figure 4:
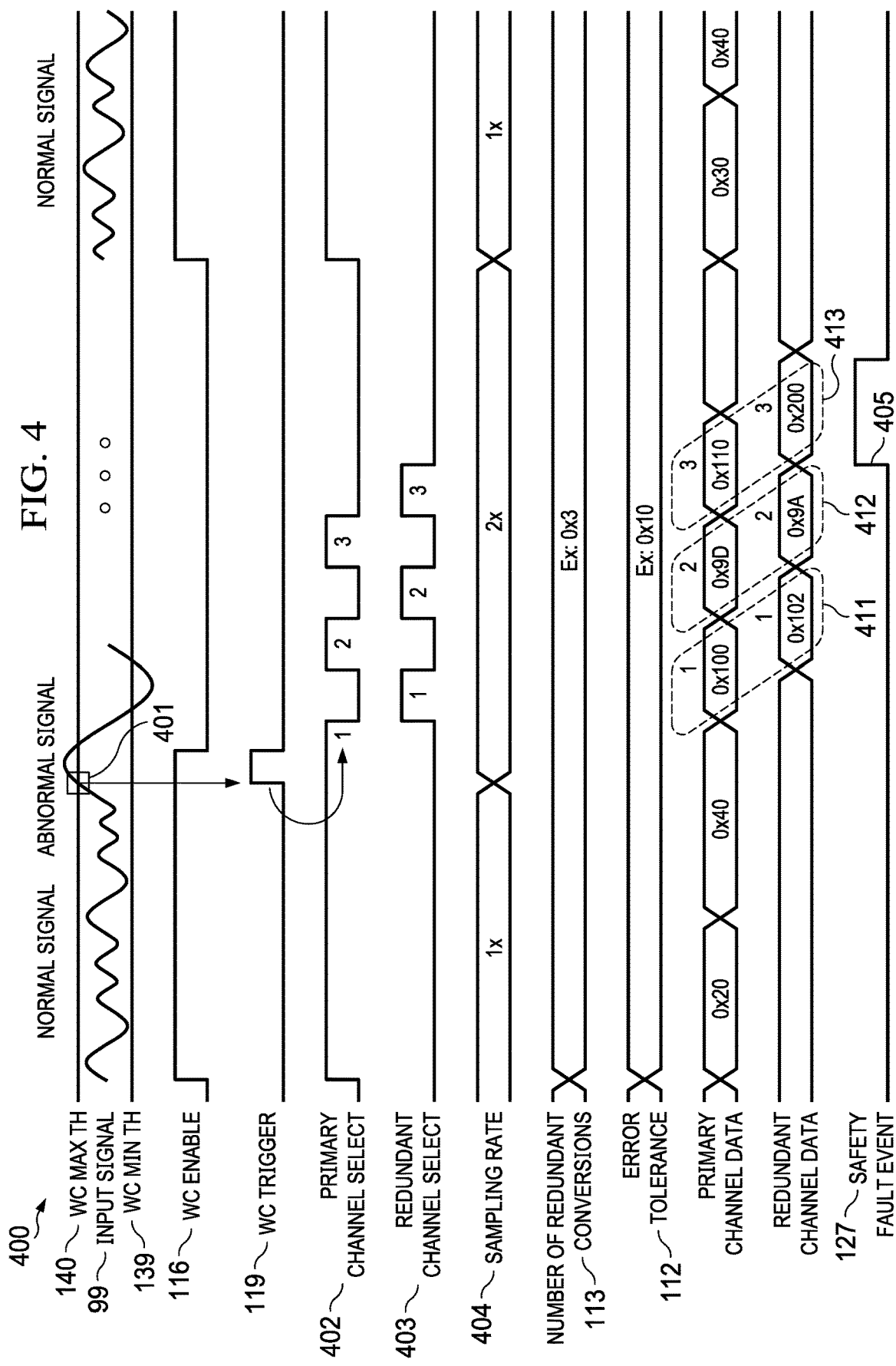
FIG. 4 illustrates a timing diagram for the ADC in an input-driven mode in accordance with an example.

FIG. 4 is a timing diagram example of the system 100 in the input-driven mode. Following conversion of an input analog signal 99 of the ADC signal path 101 to a sequence of digital values, the digital values are compared to the WC min and max thresholds 139 and 140, respectively. Reference numeral 401 indicates the deviation of the analog input signal outside the window. Once the analog input signal is detected as being outside the window defined by the WC min and max thresholds (which is indicative of a possible abnormal signal), the WC trigger signal 119 is asserted high and the functional safety controller 103 responds by forcing the WC enable signal 116 to a logic 0 (low) to disable the window comparator 105

The functional safety controller 103 also responds to the asserted WC trigger signal 119 and toggles the channel select signal 115 to cause the ADC multiplexer 132 to toggle between the primary channel 110 and the redundant channel 109 to thereby permit the result comparison circuit 104 compare successive primary/redundant channel digital conversions as explained above, and at double the sample rate (as indicated at 404). Waveforms 402 and 403 represent the assertion of the respective ADC input channels.

The number of redundant conversions 113 may be programmed for a predetermined number of pairs (3 in this example, pairs 411, 412, and 413) of primary and redundant digital values to be compared. The difference between primary/redundant digital of the each pair is compared to the error tolerance 112. In this example, the first pair 411 has an absolute difference of 0x02 which is less than the error tolerance of 0x10. The next pair 412 is processed and it too has an absolute difference (0x03) less than the error tolerance. The absolute difference of the third pair 413 is 0xF0 which is greater than the error tolerance. The result comparison circuit 104 responds by asserting the safety fault event signal 127 at 415. If the difference between digital values of a given pair 411, 412, 413 is higher than the error tolerance value 112, the safety fault event signal 127 is asserted (logic high in this example).

Figure 5:
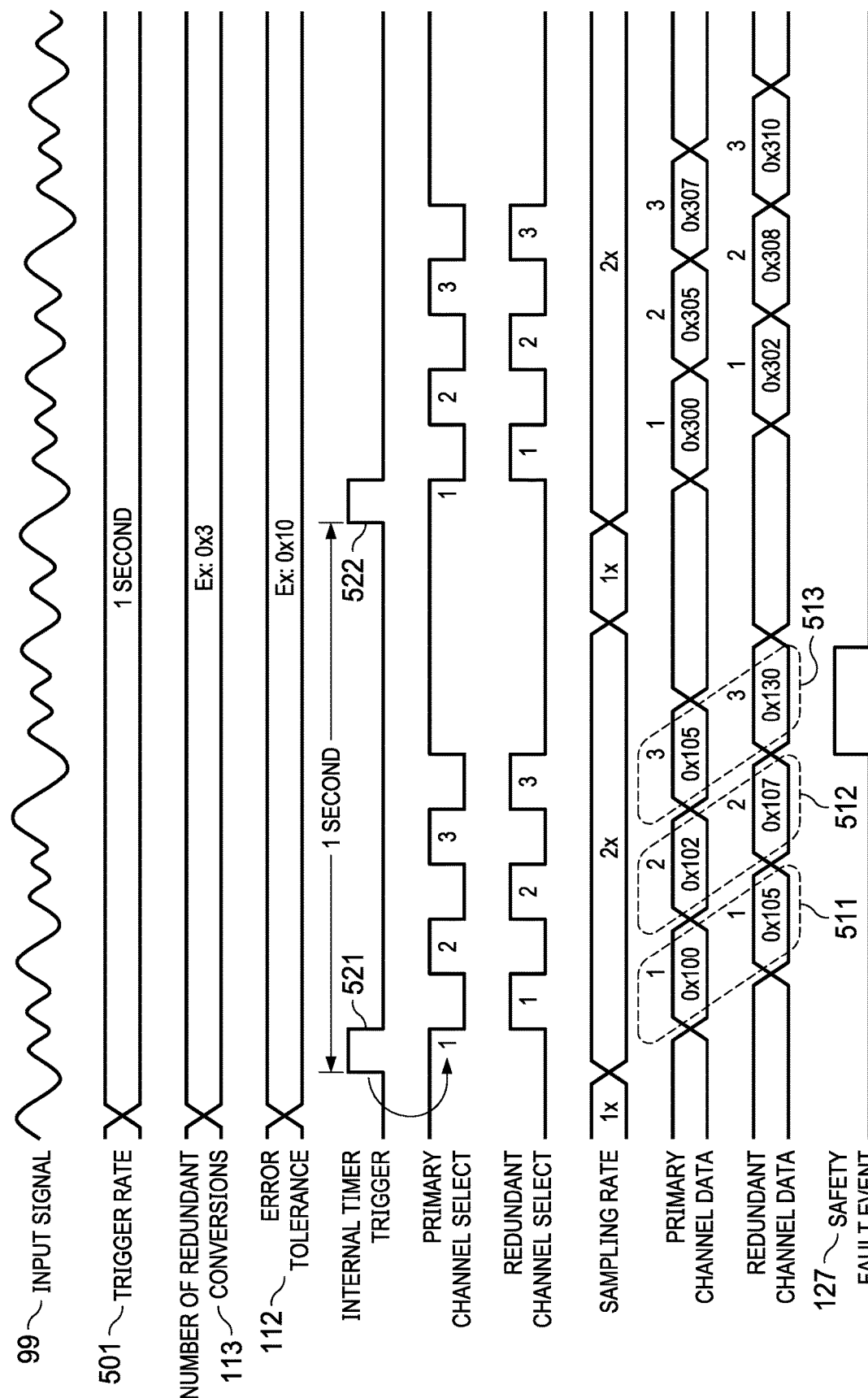
FIG. 5 illustrates a timing diagram for the ADC in an on-demand mode in accordance with an example.

FIG. 5 is a timing diagram example of system 100 in the on-demand mode. The trigger rate 501 is a rate that is either preset in the functional safety controller 103 or specified by the processor 106 to the functional safety controller 103. The trigger rate 501 is the rate at which redundant conversion and comparison is to be performed during the on-demand mode. In this example, the trigger rate is once per second which means that once per second, the functional safety controller 103 will initiate the acquisition of a specified number of pairs (113) of primary/redundant channel data to be compared by the result comparison circuit 104 as explained above. In FIG. 5, the initiation of the primary/redundant data conversion and comparison is one second apart as indicated at reference numerals 521 and 522. The pairs are shown in FIG. 5 as pairs 511, 512, and 513. During each primary/redundant sampling and comparison phase, the sampling rate doubles as shown and as described above. The absolute difference in the primary/redundant data of pairs 511 and 512 is less than the error tolerance 112, but the absolute difference for pair 513 is greater than the error tolerance 112 thereby triggering by the result comparison circuit 104 the positive assertion of the safety fault event signal 127.

Figure 6:
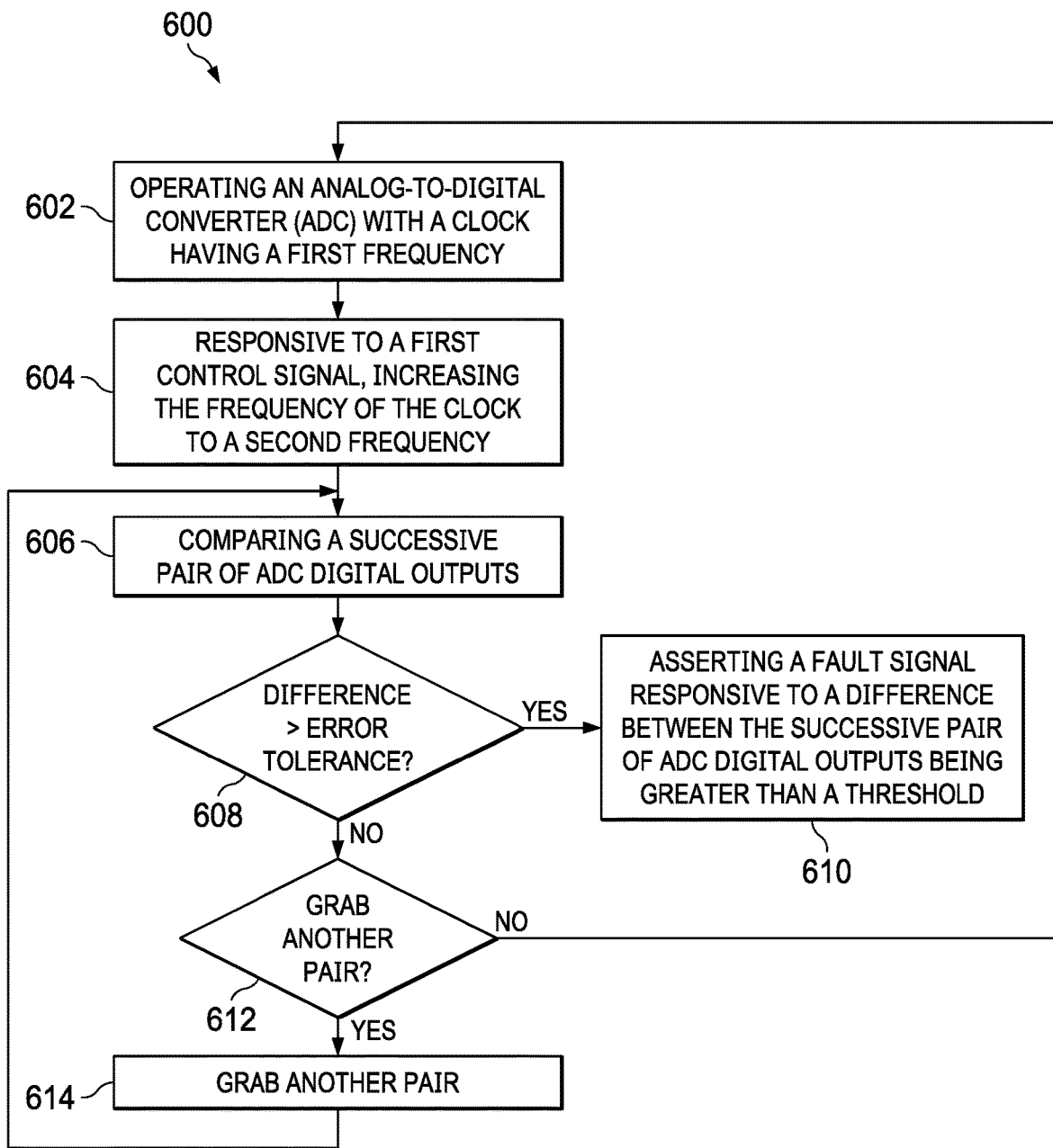
FIG. 6 is a flowchart depicting a method implemented by the ADC circuit in accordance with an example.

FIG. 6 is a flow chart depicting an illustrative method 600 in accordance with the disclosed embodiments. At 602, the method includes operating the analog-to-digital converter (ADC) with the sampling clock having a first frequency. At 604, in response to a first control signal, the method includes increasing the frequency of the clock to a second frequency (e.g., double the first frequency). The first control signal may be the WC trigger 119 asserting in response to detection by the window comparator 105 that the input analog signal is too high or too low, relative to the window. At 606 the method includes comparing (e.g., by the result comparison circuit 104) a successive pair of ADC digital outputs (e.g., from the primary and redundant channels which receive the same analog signal 99). At 608, the method includes determining whether the absolute difference of the current primary/redundant digital data pair is greater than the error tolerance. If the difference is greater than the error tolerance, then at 610 the method includes asserting a fault signal (e.g., safety fault event 127).

However, if the absolute difference is not greater than error tolerance, then the method determines whether another pair of primary/redundant digital values should be obtained and analyzed. This determination includes determining whether the number of redundant conversions 113 has already been reached. If it has not been reached, then at 614, the method includes obtaining the next primary/redundant digital data pair, and the method loops back to step 606 to repeat the analysis process of steps 608-614. If the number of redundant conversions 113 has already been reached, then the sampling frequency (ADC_CLOCK 120) is set back to its lower frequency and control loops back to step 602.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Modifications are possible in the described embodiments, and other embodiments are possible, within the scope of the claims.

What is claimed is:

1. An integrated circuit (IC), comprising:
    a controller having a first controller output, wherein the controller is configured to generate a sample rate control signal on the first controller output;
    a programmable clock circuit having a clock circuit control input and a clock output, wherein the clock circuit control input is coupled to the first control output, the programmable clock circuit configured to output a clock signal on its clock output at a first frequency responsive to the sample rate control signal being in a first logic state, and to output the clock signal at a second frequency responsive to the sample rate control signal being in a second logic state;
    an analog-to-digital converter (ADC) having an analog input, a clock input and a digital conversion output, the clock input coupled to the clock output; and
    a result comparison circuit having a comparison input coupled to the digital conversion output, the result comparison circuit configured to compare a first digital conversion output from the ADC to a second digital conversion output from the ADC.

2. The IC of claim 1, wherein the controller has a first controller input, and the IC further comprises a window comparator having a window comparator input coupled to the ADC, the window comparator having a window comparator output coupled to the first controller input, the window comparator configured to generate a trigger signal on the window comparator output responsive to a comparison of a digital output value from the digital conversion output to first and second thresholds.

3. The IC of claim 2, wherein the controller is configured to assert the sample rate control signal responsive to the logic state of the trigger signal.

4. The IC of claim 2, wherein:
    the controller has a second controller output;
    the ADC includes a multiplexer having a first analog input, a second analog input, and a multiplexer selection input, the multiplexer selection input coupled to the second controller output; and
    the controller is configured to generate a channel select signal on the second controller output responsive to the logic state of the trigger signal.

5. The IC of claim 1, wherein the second frequency is twice the first frequency.

6. The IC of claim 2, wherein the controller is configured to disable the window comparator responsive to the trigger signal.

7. The IC of claim 1, wherein the result comparison circuit is configured to compare an absolute difference between the first and second digital conversion outputs to an error tolerance signal.

8. The IC of claim 7, wherein the result comparison circuit is configured to generate a safety fault responsive to the absolute difference being greater than the error tolerance signal.

9. The IC of claim 7, wherein the result comparison circuit is configured to receive the error tolerance signal.

10. The IC of claim 2, wherein the controller further is configured to receive a control signal indicative of an input-driven mode or an on-demand mode.

11. The IC of claim 10, wherein the controller is configured to disable the window comparator responsive to the on-demand mode.

12. The IC of claim 10, wherein, while in the input-driven mode responsive to assertion of the trigger signal from the window comparator, the controller is configured to disable the window comparator and to cause the result comparison circuit to subtract the first digital conversion output from the ADC from the second digital conversion output from the ADC.

13. The IC of claim 11, wherein, while in the on-demand mode, the controller is configured to periodically subtract successive pairs of digital conversion outputs from the ADC.

14. The IC of claim 10, wherein, while in the on-demand mode, the controller is configured to disable the window comparator.

15. The IC of claim 14, wherein, while in the on-demand mode, the controller is configured to initiate comparison of successive pairs of digital conversion outputs from the ADC responsive to a timer.

16. The IC of claim 1, further including:
    a multiplexer having first and second inputs and a selection input, the first and second inputs are configured to receive first and second values, respectively, the second value being one-half of the first value, the selection input coupled to the controller; and
    a clock divider having a clock input and a clock output, the clock divider configured to divide down a clock signal on the clock input by a value output by the multiplexer, the clock output is coupled to the ADC.

17. The IC of claim 16, wherein the controller is configured to cause the multiplexer to select the second value and to cause the result comparison circuit to subtract pairs of digital conversion outputs from the ADC.

18. An integrated circuit (IC), comprising:
    an analog-to-digital converter (ADC) having selectable first and second analog channel inputs and a digital output;
    a window comparator coupled to the digital output, the window comparator configured to compare a digital value on the digital output to first and second threshold values defining a window and to assert a trigger signal responsive to the digital value being outside the window;

a programmable clock circuit configured to provide a clock signal to the ADC; and a controller that, response to assertion of the trigger signal, is configured to generate a sample rate control signal to the clock circuit to cause the clock circuit to increase the frequency of the clock signal and toggle selection between the first and second analog channel inputs; and a result comparison circuit having a comparison input coupled to the digital output, the result comparison circuit configured to compare a first digital conversion output from the ADC to a second digital conversion output from the ADC.

19. The IC of claim 18, wherein, responsive to assertion of the trigger signal, the controller is also configured to disable the window comparator.

20. The IC of claim 18, wherein the result comparison circuit is configured to determine whether a difference between the first and second digital conversion outputs is greater than a threshold.

21. A method, comprising:
operating an analog-to-digital converter (ADC) with a clock having a first frequency;
responsive to a first control signal, increasing the frequency of the clock to a second frequency; and
comparing a successive pair of ADC digital outputs; and
asserting a fault signal responsive to a difference between the successive pair of ADC digital outputs being greater than a threshold.

22. The method of claim 21, wherein responsive to the first control signal, disabling a window comparator.

23. The method of claim 21, further comprising, asserting, by a window comparator, the first control signal responsive to a digital output being above or below a window implemented by the window comparator.

* * * * *